United States Patent [19]
Onuma et al.

[11] Patent Number: 5,526,601
[45] Date of Patent: Jun. 18, 1996

[54] FLEXURE SENSOR AND FISHING ROD EQUIPPED THEREWITH

[75] Inventors: Tadashi Onuma, Ibaraki-ken; Takashi Sato, Tsuchiura; Nobuhiro Moriyama, Iwaki, all of Japan

[73] Assignee: Kureha Kagaku Kogyo Kabushiki Kaisha, Tokyo, Japan

[21] Appl. No.: 340,867

[22] Filed: Nov. 15, 1994

[30] Foreign Application Priority Data

Dec. 14, 1993 [JP] Japan ...................... 5-341997

[51] Int. Cl.⁶ .......................... A01K 97/12; H04R 17/00
[52] U.S. Cl. ................... 43/17; 73/774; 73/862.641; 73/DIG. 4
[58] Field of Search ..................... 43/17, 25, 18.1; 73/774, 862.641, DIG. 4, 862.635

[56] References Cited

U.S. PATENT DOCUMENTS

| | | | |
|---|---|---|---|
| 3,118,301 | 1/1964 | Bajenski et al. | 73/774 |
| 4,276,711 | 7/1981 | Mathauser | 43/17 |
| 4,615,214 | 10/1986 | Burns | 73/DIG. 4 X |

FOREIGN PATENT DOCUMENTS

| | | |
|---|---|---|
| 57-4850 | 1/1982 | Japan . |
| 63-149503 | 6/1988 | Japan . |
| 6-22396 | 1/1994 | Japan . |

*Primary Examiner*—Richard K. Seidel
*Assistant Examiner*—Jeanne M. Elpel
*Attorney, Agent, or Firm*—Wenderoth, Lind & Ponack

[57] ABSTRACT

A generally tubular flexure sensor is constituted by winding a piezoelectric element including a polymeric piezoelectric strip provided with oppositely disposed surface electrode layers on both surfaces around a central axis (helical axis) so that the surface electrode layers are disposed substantially in parallel with an extension direction of the helical axis, and combining the helically wound piezoelectric element with a detection circuit for detecting a flexural deformation of the piezoelectric element in a direction perpendicular to the helical axis. The flexure sensor allows a large degree of flexural deformation in any direction to provides a good sensitivity and can be suitably used as a fish catch signal sensor for a fishing rod.

11 Claims, 3 Drawing Sheets

5,526,601

FLEXURE SENSOR AND FISHING ROD EQUIPPED THEREWITH

FIELD OF THE INVENTION AND RELATED ART

The present invention relates to a flexure sensor to be attached to an object so as to detect a flexure of the object by the generation of an electric signal caused by a flexure of a piezoelectric element or device, and a fishing rod equipped with the flexure sensor.

Japanese Laid-Open Patent Application (JP-A) 63-149503, for example, has disclosed an apparatus in which a flexure angle of a joint means of a robot is detected by a bimorph-type piezoelectric sheet comprising a polymeric piezoelectric material.

In this way, it has been known that it is possible to detect an electric signal corresponding to a degree of bending (flexure) of a piezoelectric element, i.e., that a piezoelectric element can be used as a flexure sensor. It is also evident that a polymeric piezoelectric element having an excellent flexibility is more suited as a sensor capable of detecting a large degree of flexure compared with a ceramic piezoelectric element.

There has been also proposed a fixing rod having a piezoelectric pick-up element applied to a relevant part thereof so as to give an angler a fish catch signal, i.e., a signal that a fish has been caught by a fish hook (e.g., Japanese Utility Model Publication 57-4850).

However, a conventional piezoelectric element supplied in the form of a tube, plate or sheet, has the following problems when used as a flexure sensor. First, a tubular piezoelectric element even when composed of a polymeric piezoelectric material is insufficient in stretchability so as to deform following the flexure of an object. Further, a plate or sheet-form piezoelectric element has a sufficient flexural deformability in a direction perpendicular to the surfaces thereof so as to follow a flexure of an object, but a flexure thereof in a direction parallel to the surfaces thereof cannot be expected at all.

Thus, when a sheet-form polymeric piezoelectric element is used in a conventional manner, the allowable degree of flexural deformation in a direction parallel to the surfaces of the sheet-form element is very small, and there arises a high risk of an excessive stress applied to the element in case where the object is also deformed in that direction. This is because even a polymeric piezoelectric material has a limitation in its stretchability and also the stretchability of electrodes formed on both surfaces of the piezoelectric material for taking out an electric signal therefrom is very poor. The reduced stretchability of a sheet-form piezoelectric element poses a serious restriction on the use thereof, e.g., in the form of being applied onto a fishing rod as described above.

Another difficulty with the use of a sheet-form piezoelectric element is that it shows different piezoelectric properties between a direction perpendicular to and a direction parallel to the surfaces thereof in response a deformation of an object.

SUMMARY OF THE INVENTION

An object of the present invention is to provide a flexure sensor comprising a piezoelectric element constituted in a form wherein it shows a large amount of allowable flexural deformation and shows an isotropic piezoelectric property, i.e., little difference in piezoelectric output in response to deformations in a longitudinal direction and in a direction perpendicular thereto.

Another object of the present invention is to provide a fishing rod equipped with such a flexure sensor as a fish catch signal sensor.

More specifically, according to the present invention, there is provided a flexure sensor, comprising:

a piezoelectric element comprising a polymeric piezoelectric strip provided with surface electrode layers oppositely disposed on both surfaces thereof and helically wound around a central axis so that the surface electrode layers are disposed substantially in parallel with an extension direction of the central axis, and a detection circuit for detecting an electric signal from the piezoelectric element occurring due to a flexural deformation of the helically wound polymer piezoelectric strip generally extending in the extension direction.

The above-prepared piezoelectric element in the form of a helically wound strip has a stretchability along its helical strip which is identical to that of a conventional sheet-form piezoelectric element, but has a very large amount of allowable flexural deformation in its generally elongated direction, i.e., its helical axis direction, and also shows an isotropic piezoelectric property in various directions perpendicular to its helical axis. Accordingly, the flexure sensor of the present invention is suitable for detecting a flexural deformation of an object, such as a joint means of a robot, an electricity transmission line, a supporting rope of a suspension bridge, etc., in which the direction of flexural deformation is not specified to a particular direction among various directions perpendicular to the elongation direction of the object.

Further, the fishing rod according to the present invention comprising a main rod and the above-mentioned flexure sensor attached to the main rod, preferably in a manner such that the axis of the main rod and the helical axis of the helically disposed piezoelectric element substantially coincide each other, may be provided with a function of effectively detecting an electric signal caused by a large degree of flexural deformation in an arbitrary direction around the fishing rod as a fish catch signal. As a result, it is possible to attain a substantial improvement with respect to a problem accompanying the use of an acceleration sensor, as a fish catch signal sensor, attached to the tip of a fishing rod such that the fish catch signal cannot be readily differentiated from an acceleration change caused by a movement of the fishing rod, or a change in environmental condition, such as impingement of water, wave or wind.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
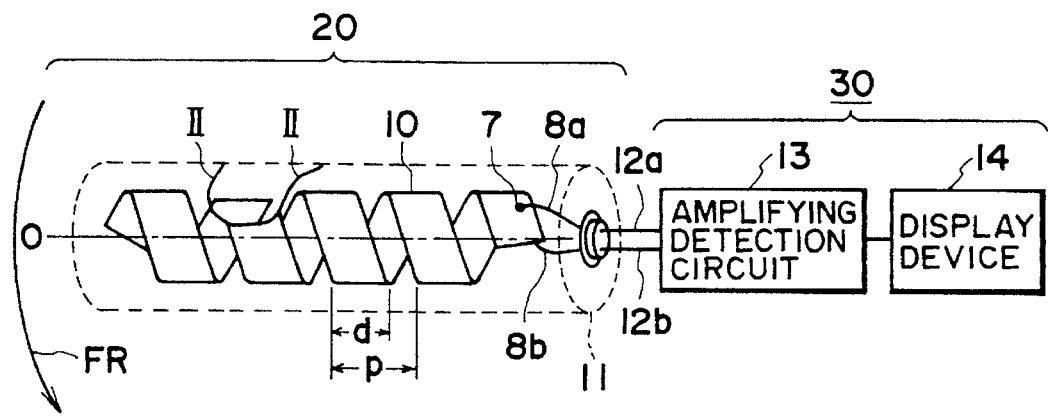
FIG. 1 is an illustration of an embodiment of the flexure sensor according to the present invention including a partially cut-out perspective illustration of a helical piezoelectric element.
Figure 2:
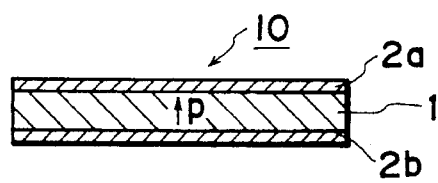
FIG. 2 is a thicknesswise schematic sectional view of a strip-form piezoelectric element taken along a cut-out line II—II in FIG. 1.

FIG. 1 is a schematic illustration of a flexure sensor having a relatively simple structure including a helical piezoelectric element (detector section or detector element) 20 and constituted so as to be inserted into a hollow tubular section of a fishing rod according to an embodiment of the present invention, and FIG. 2 is a thicknesswise sectional view of a strip-form piezoelectric element taken along a line II—II in FIG. 1.

Referring to FIGS. 1 and 2, a strip-form piezoelectric element 10 constituting the helical piezoelectric element comprises a flexible piezoelectric strip 1 and surface electrodes 2a and 2b disposed on both sides of the piezoelectric strip 1. The helical piezoelectric element has a helical shape formed by winding the strip-form piezoelectric element 10 helically around a certain central axis (helical axis) O. From the surface electrodes 2a and 2b, lead wires 8a and 8b are respectively taken out by connection with a solder 7 to constitute a detector section 20. Thus, an electric signal accompanying a flexural deformation FR bending the helical axis 0 of the piezoelectric element is detected via the lead wires 8a and 8b by an amplifying detection circuit and displayed on a display or notifying device 14, such as a liquid crystal display. The amplifying detection circuit 13 and the display device 14 are integrated to form a display apparatus 30. Incidentally, the display or notifying device 14 may comprise an alarm circuit, such as a buzzer, instead of or in addition to a visual display device.

The width (d) and helical pitch (p) of the strip-form piezoelectric element may be appropriately determined depending on the characteristics required of the flexure sensor. Generally, the width (d) may be on the order of 2–50 mm, preferably 5–20 mm, and may preferably satisfy the range of $1 < p/d \leq 3$. If the width is below 2 mm, the piezoelectric element is liable to be broken during the winding operation and, if the width exceeds 50 mm, it becomes difficult to shape the element into a helix. Further, if $p/d \leq 1$, the strip-form piezoelectric element 10 partially overlaps or is liable to cause an electrical noise due to contact between electrodes 2a or between electrodes 2a and 2b. On the other hand, if $p/d > 3$, the resultant flexure sensor is provided with a low areal efficiency. The helical piezoelectric element may preferably be formed by winding the strip-form piezoelectric element with at least one turn, particularly three or more turns, so as to ensure an isotropic sensitivity characteristic as described above.

Regarding the materials of the respective members, in order to provide the entire helical piezoelectric element with a good flexibility and/or form a long helical piezoelectric element, the flexible piezoelectric strip 1 is constituted of a piezoelectric polymer. Such a piezoelectric polymer may be formed into a strip 1 having surface electrodes 2a and 2b on both surfaces, which can be easily formed into a helical shape as shown in FIG. 1.

The polymeric piezoelectric strip 1 may be composed of any known piezoelectric polymer, suitable examples of which may include: VDF (vinylidene fluoride)-type piezoelectric material inclusive of homopolymer and copolymers of VDF (vinylidene fluoride), and vinyl cyanide-vinyl acetate copolymers having a relatively high heat resistance.

Such a piezoelectric polymer may be formed, e.g., by melt-extrusion, into a film, which is then subjected to uniaxial stretching or heat-treatment below the softening temperature, as desired, and then a polarization treatment by application of an electric field at a temperature below the softening temperature, to form a piezoelectric polymer film. The piezoelectric polymer 1 may generally assume a form of a film or sheet, and the thickness thereof may preferably be on the order of 5–2000 μm, particularly 100–1000 μm. A piezoelectric strip or piezoelectric polymer 1 having a thickness of below 5 μm generally does not provide a sufficient output (voltage) at the time of flexural deformation. On the other hand, if the thickness exceeds 2000 μm, the flexibility of the piezoelectric strip 1 may be impaired, and a high voltage is required for the polarization, thus being liable to cause a surface discharge, so that the polarization treatment becomes difficult.

The surface electrodes 2a and 2b may be formed in a thickness in the range of 0.02 μm–200 μm on the piezoelectric polymer 1, e.g., by vapor deposition, thermal spraying, plating (particularly, electroless plating) or adhesion of a foil of an electroconductive material, such as silver, copper, aluminum or zinc, without impairing the flexibility as a whole of the helical piezoelectric element. Among these, in order to provide a good solderability and an excellent flexure detection characteristic while retaining good flexibility in combination with the piezoelectric polymer 1, it is particularly preferred to form the opposite electrodes 2a and 2b as a thermally sprayed electrode layer of a thickness of 10–100 μm, especially 20–150 μm. Another preferred embodiment of the opposite electrodes 2a and 2b is a perforated sheet electrode embedded at a surface layer of the piezoelectric polymer 1 (as described in U.S. Pat. No. 5,410,210 as it provides a strongly joined integral structure between the electrodes and the piezoelectric polymer 1 and also the electrodes per se retain their stretchability. The perforated sheet may preferably have a pore diameter of 20–300 μm and an opening ratio of 30–80%. Preferred examples of the perforated sheet electrode may include a punched metal sheet and a metal wire net.

Figure 3:
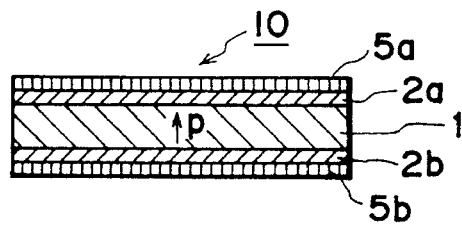
FIG. 3 is a thicknesswise schematic sectional view of a strip-form piezoelectric element having an insulating coating layer corresponding to FIG. 2.

The electrodes 2a and 2b in the helical piezoelectric element of the present invention may be surface-coated with an insulating coating. Such an insulating coating may, for example, be formed as, e.g., insulating coating layers 5a and 5b selectively covering the electrodes 2a and 2b as shown in FIG. 3 corresponding to FIG. 2. More preferably, however, as shown in FIG. 1, the entirety of the helical piezoelectric strip 10 may be embedded within an insulating material 11 to form a solid bar-shaped (or a hollow tube-shaped) piezoelectric element which is tough and shows an easy handling characteristic. The insulating coating 5a, 5b or 11 may preferably comprise an elastomer, such as urethane rubber, silicone rubber or butyl rubber, in order to retain the flexibility of the helical piezoelectric element as a whole in addition to provision of toughness.

In this instance, in order to provide an improved measurement sensitivity and accuracy by preventing a residual stress from being applied to the piezoelectric strip 10, it is preferred to once wind the piezoelectric strip 10 about a rigid or elastic bar to shape the strip into a helix, remove the bar and then embed the helically shaped piezoelectric strip 10 in an elastomeric coating body 11. As a result, it is possible to obtain a flexure detection element 20 in the form of a solid bar as shown in FIG. 1 (or a hollow tube) having a good flexibility and a good flexure detecting characteristic, in combination, as a whole.

It is also possible to embed additional members, such as an amplifying detector 13, or a reinforcing member or a filler material within an extent of not impairing the flexibility, at a central part of the embedding body or form a hollow part at such a central part so as to store such additional members.

Figure 4:
FIGS. 4 and 5 are respectively a front view of an embodiment of the fishing rod equipped with a flexure sensor according to the present invention.

In case of using a detection element 20 substantially in the form of a bar as described above as a fish catch signal sensor of a fishing rod, it is preferable to dispose the element in a hollow part of the fishing rod at a position showing a largest degree of bending (warp) of a fishing rod 40 (not always a tip portion of a fishing rod) as show in FIG. 4. A piezoelectric output caused by the bending is led out through a cable 8 (8a, 8b) disposed inside the rod 40 to a display apparatus (e.g., a liquid crystal apparatus) 30 including the amplifying detection circuit and the display device and disposed at a hand grip 41 for readout.

Figure 5:
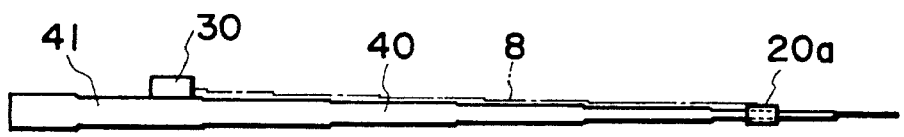

On the other hand, if a hollow tube-shaped detective element 20a is formed at the time of embedding the helical piezoelectric strip 10 as described above, it is possible to dispose such a hollow-tube detective element 20a like a sheath fitting a peripheral part at a position showing a largest bending of a rod 40 as shown in FIG. 5. Also in the case of detecting a flexural deformation of a string-like object, such as an electricity transmission line or a supporting rope for a suspension bridge, as described above, it is preferable to use a hollow tube-shaped detective element, like a sheath through which the object is inserted.

Figure 6A:
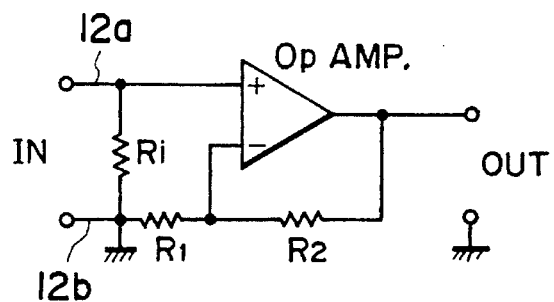
FIGS. 6A–6D are circuit diagrams each showing an example of the amplifying detection circuit constituting a flexure sensor.
Figure 6B:
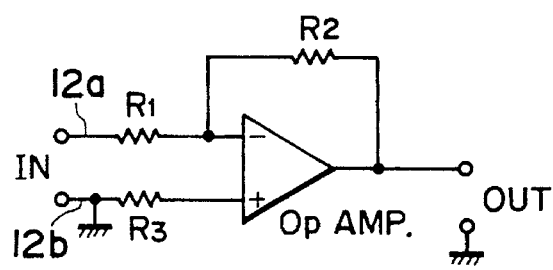
Figure 6C:
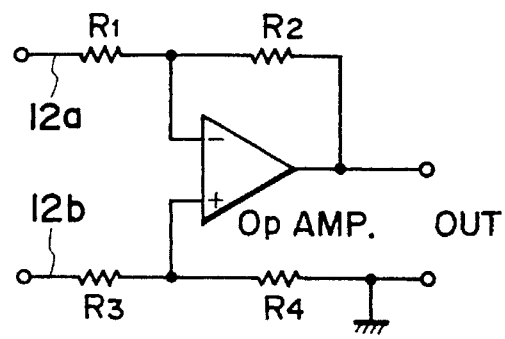
Figure 6D:
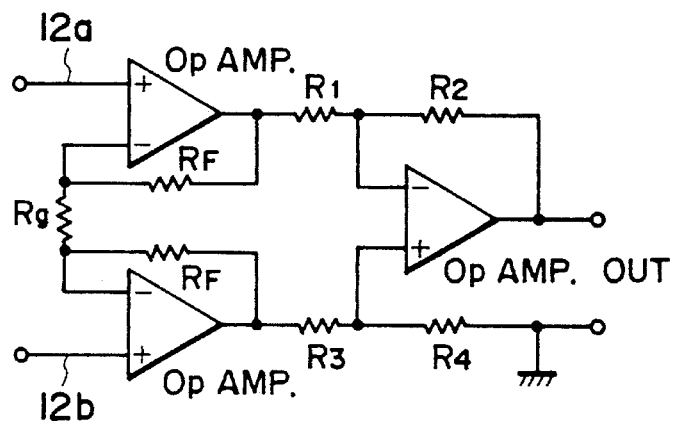

FIGS. 6A–6D show various embodiments of the amplifying detection circuit 13 shown in FIG. 1. FIGS. 6A and 6B show embodiments of a non-inverting amplifier circuit including an operational amplifier (Op Amp), of which the one shown in FIG. 6A provides a higher impedance. FIGS. 6C and 6D show balanced differential amplifier circuits, of which the one shown in FIG. 6D provides a better performances with respects of a higher gain, a higher impedance and a larger common mode rejection ratio.

It is interesting to note the fact that the piezoelectric strip 1 constituting the helical piezoelectric element 10 shown in FIGS. 1–3 provides an electric signal corresponding to its flexural deformation regardless of its single layer (i.e., monomorph) structure. It has been generally believed that a piezoelectric sheet, particularly a polymeric piezoelectric sheet, does not provide a substantial voltage output (change in electric charge) in response to a flexural deformation. This is because, when such a polymeric piezoelectric sheet causes an ideal flexural deformation with its mid plane in the thickness direction as a neutral plane of deformation, the sheet elongates at one of the two surfaces and shrinks at the other surface and the sheet has a single direction of polarization p in the thickness direction as show in FIGS. 2 and 3, so that identical amounts of charges are induced at both surfaces.

Accordingly, it has been practiced to apply another film onto one surface of a piezoelectric sheet or use one electrode having a larger rigidity than the other electrode so as to cause the neutral plane of deformation of the piezoelectric sheet to deviate from its thicknesswise mid plane, thereby obtaining a voltage output in response to a flexural deformation. It has been confirmed, however, that the helical piezoelectric strip used in the present invention provides a good voltage output in response to a flexural deformation even without such an additional measure in the piezoelectric strip per se. This is presumably because, as a result of helical winding as described above, a flexural deformation occurring in the helical piezoelectric strip as a whole causes an asymmetrical stretching-shrinkage deformation at both surfaces of the piezoelectric strip. It is however preferred to adopt such an additional measure of causing the deviation of the neutral plane of deformation in order to attain a better output.

In order to effectively take out a flexural deformation as an electric signal, it is further preferable to provide a piezoelectric strip 1 in a bimorph structure wherein a pair of polymeric piezoelectric strips 1a and 1b are disposed in lamination to sandwich a central electrode layer 3 so that their polarization directions p are identical to each other, and surface electrode layers 2a and 2b are disposed outside thereof. Each of the piezoelectric strips 1a and 1b can assume a laminated structure including a further plurality of piezoelectric strips.

The central electrode layer 3 may preferably comprise a thermally sprayed electrode layer having a higher rigidity than each of the surface electrodes 2a and 2b, or a metal of copper, aluminum, tin, zinc, gold, silver, platinum, etc., in a thickness on the order of 6–200 μm, particularly 20–120 μm. It is however still possible to constitute the central electrode layer 3 as a vapor-deposited electrode layer in a fashion similar to that of the surface electrode layers 2a and 2b. The central electrode layer 3 may be applied to the piezoelectric strips 1a and 1b with adhesive layers 4a and 4b, respectively, but one of the adhesive layers 4a and 4b can be omitted in case where the central electrode layer 3 is formed by thermal spraying or vapor deposition.

The adhesive layers 4a and 4b can comprise an electroconductive adhesive containing electroconductive particles dispersed therein, or an adhesive of epoxy resin, urethane resin, polyester resin, butadiene resin, acrylic resin, etc., while retaining a good output characteristic, if it is formed in a layer on the order of 5–40 μm in thickness.

Figure 7:
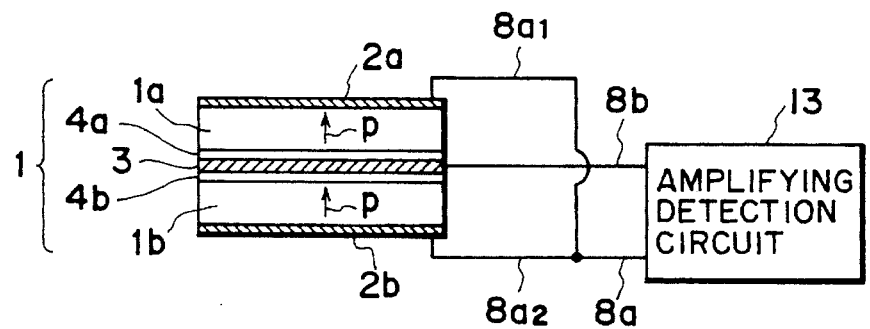
FIG. 7 is a schematic illustration of a flexure sensor including a strip-form piezoelectric element having a bimorph structure.
Figure 8:
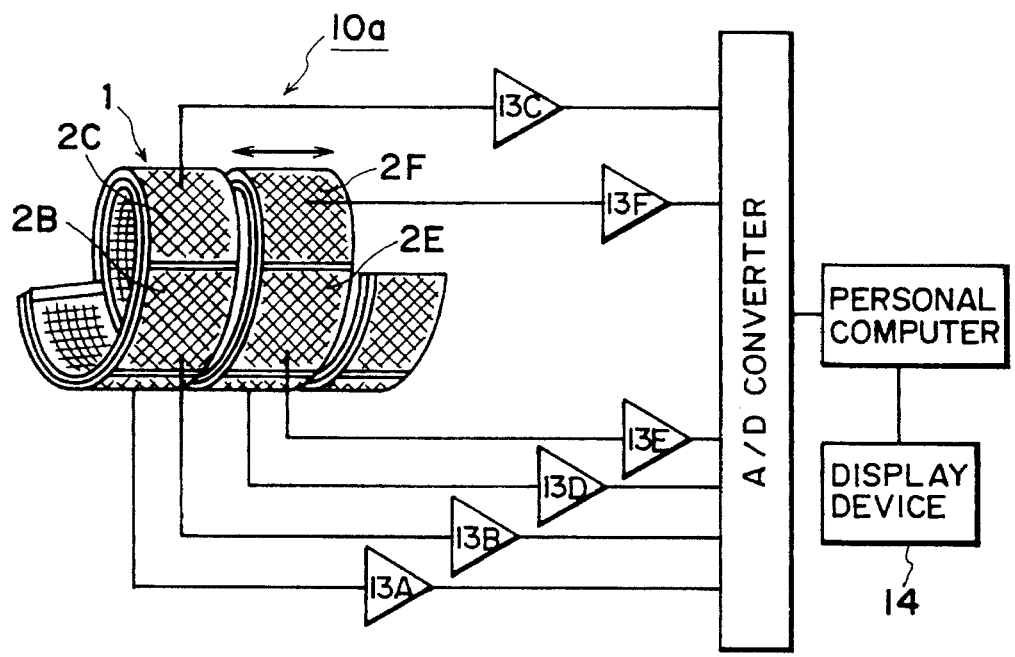
FIG. 8 is a schematic illustration of a flexure sensor including a strip-form piezoelectric element having discrete elements.

The above described embodiments of the flexure sensor according to the present invention provide an identical output in response to a flexural deformation in any direction of bending the helical axis of the helical piezoelectric element. In some cases, however, it is desirable to further detect the direction of the flexural deformation. In such a case, it is possible to divide at least one of the surface electrodes 2a and 2b (or, e.g., both of the surface electrodes 2a and 2b while retaining the central electrode layer 3 as it is in the case of a bimorph structure as shown in FIG. 7) into discrete sections 2A (2Aa, 2Ab), 2B (2Ba, 2Bb), 2C, 2D . . ., thereby dividing the helical piezoelectric element into a plurality of element sections, so that the flexural deformations of the respective element sections are separately detected in a manner as shown in FIG. 8. More specifically, the voltage signals from the respective element sections are amplified and detected by respective amplifying detection circuits 13A, 13B . . . and subjected to A/D conversion and processing by a personal computer, so as to detect flexural deformation signals occurring in the helical piezoelectric element separately for respective angular sections (for detection of bending direction) and/or for longitudinal sections (if necessary, possible to dispose a plurality of piezoelectric elements at plural longitudinal positions). And, as a combination of deformation outputs from the respective element sections processed by the computer, it is possible to obtain the amount of flexural deformation as well as the direction of the flexural deformation. For this purpose, it is preferred to dispose the surface electrode sections 2A, 2B, . . . at equi-angular intervals, e.g., at each 60 degrees, 120 degrees (as shown in FIG. 8) or 180 degrees, so as to form equi-angular sections of the piezoelectric element.

As described above, according to the present invention, a polymeric piezoelectric strip having an excellent flexibility is helically wound around an axis to constitute a flexure sensor which provides an effective piezoelectric output in response to a flexural deformation which is large and occurs in an arbitrary direction and can also provide additional information regarding the direction of the flexural deformation, if necessary. There is also provided a fishing rod equipped with the fishing rod as a fish catch signal sensor. The fishing rod is also advantageously used particularly in detection of a large degree of flexural deformation occurring in an indefinite direction as encountered in, e.g., a joint means of a robot, an electricity transmission line and a supporting rope in a suspension bridge.

What is claimed is:

1. A flexure sensor, comprising:
   a piezoelectric element comprising a polymeric piezoelectric strip provided with surface electrode layers oppositely disposed on both surfaces thereof and helically wound around a central axis so that the surface electrode layers are disposed substantially on a cylindrical plane surrounding the central axis, and
   a detection circuit for detecting an electric signal from the piezoelectric element occurring due to a flexural deformation of the helically wound polymer piezoelectric strip generally extending in an extension direction of the central axis.

2. A flexure sensor according to claim 1, wherein said polymeric piezoelectric strip comprises a pair of polymeric piezoelectric strips disposed in lamination so as to sandwich a central electrode therebetween.

3. A flexure sensor according to claim 1, wherein the surface electrode layer disposed on at least one side of the polymer piezoelectric strip is divided into plural discrete sections so as to provide functionally plural piezoelectric elements.

4. A flexure sensor according to claim 3, wherein said plural piezoelectric elements are disposed at intervals of a constant angle around the central axis.

5. A flexure sensor according to claim 1, wherein the surface electrode layers are covered with an insulating coating.

6. A flexure sensor according to claim 1, wherein the helically wound piezoelectric element is embedded within an elastomeric coating so as to provide said piezoelectric element in the form of a solid cylindrical bar.

7. A flexure sensor according to claim 1, wherein the helically wound piezoelectric element is embedded within an elastomeric coating so as to provide said piezoelectric element in the form of a hollow cylindrical tube.

8. A fishing rod comprising a main rod and a flexure sensor according to one of claims 1–7 attached to a part of the main rod.

9. A fishing rod according to claim 8, wherein the helically wound piezoelectric element is attached to the main rod so that the central axis of the piezoelectric element substantially coincides with a central axis of the main rod.

10. A fishing rod comprising a main rod and a flexure sensor according to one of claims 1–6, wherein the piezoelectric element is inserted into a hollow part of the main rod.

11. A fishing rod comprising a main rod and a flexure sensor according to one of claims 1–5 and 7, wherein the piezoelectric element is fitted like a sheath about a peripheral part of the main rod.

* * * * *